United States Patent
Muehe et al.

(10) Patent No.: US 8,470,093 B2
(45) Date of Patent: Jun. 25, 2013

(54) DEVICE FOR PULLING A SINGLE CRYSTAL

(75) Inventors: Andreas Muehe, Wetzlar (DE); Alfred Miller, Emmerting (DE); Johann-Andreas Huber, Ainring (DE)

(73) Assignee: Siltronic AG, Munich (DE)

( * ) Notice: Subject to any disclaimer, the term of this patent is extended or adjusted under 35 U.S.C. 154(b) by 946 days.

(21) Appl. No.: 12/560,656

(22) Filed: Sep. 16, 2009

(65) Prior Publication Data

US 2010/0064965 A1 Mar. 18, 2010

(30) Foreign Application Priority Data

Sep. 17, 2008 (DE) .......................... 10 2008 047 599

(51) Int. Cl.
*C30B 15/02* (2006.01)
(52) U.S. Cl.
USPC .................. 117/218; 117/20; 117/34; 117/35
(58) Field of Classification Search
USPC ........................................ 117/20, 34, 35, 218
See application file for complete search history.

(56) References Cited

U.S. PATENT DOCUMENTS

| | | | | |
|---|---|---|---|---|
| 5,126,113 | A | * | 6/1992 | Yamagishi et al. ........... 117/218 |
| 5,843,229 | A | | 12/1998 | Kimura et al. |
| 5,879,448 | A | * | 3/1999 | Urano et al. ..................... 117/13 |
| 6,117,234 | A | * | 9/2000 | Yamagishi ..................... 117/218 |
| 6,299,684 | B1 | * | 10/2001 | Schulmann .................... 117/218 |
| 6,372,040 | B1 | * | 4/2002 | Yamagishi ....................... 117/14 |
| 2002/0073919 | A1 | * | 6/2002 | Kawanishi et al. ........... 117/218 |
| 2008/0022922 | A1 | | 1/2008 | Altekruger et al. |
| 2009/0188425 | A1 | * | 7/2009 | Altekruger et al. ............. 117/15 |

FOREIGN PATENT DOCUMENTS

JP 2000281487 A 10/2000

* cited by examiner

*Primary Examiner* — Bob M Kunemund
(74) *Attorney, Agent, or Firm* — Leydig, Voit & Mayer, Ltd.

(57) ABSTRACT

A device for pulling a single crystal from a melt having a widened portion between an upper and a lower neck portion including a pulling device having a pulling device cable drum configured to wind a pulling cable, the pulling cable configured to pull the single crystal and a supporting device configured to relieve the upper neck portion of a weight of the single crystal.

4 Claims, 4 Drawing Sheets

DEVICE FOR PULLING A SINGLE CRYSTAL

Priority is claimed to German Application No. DE 10 2008 047 599.8, filed on Sep. 17, 2008, the entire disclosure of which is incorporated by reference herein.

The invention relates to a device for pulling from a melt a single crystal having a widened portion between two neck portions.

BACKGROUND

For the purpose of reducing costs, it is desirable for the production of single crystals to achieve the greatest possible crystal diameters and crystal lengths. This becomes particularly clear from the example of silicon single crystals which are pulled with a nominal diameter of 300 mm and a weight of more than 300 kg on an industrial scale according to the Czochralski method. Corresponding processes for producing single crystals having a nominal diameter of 450 mm are already being developed.

When a seed crystal is positioned on a melt, the thermal shock causes dislocations which have to be eliminated before the single crystal can be pulled. Dislocations have been proven to be eliminated by a comparatively thin neck portion initially being pulled, in the course of which dislocations are forced out of the crystal. In the case of heavy single crystals, in particular in the case of silicon single crystals which have a weight of more than 300 kg, the tensile strength in the neck portion is generally too weak to be able to withstand the load. It has therefore become accepted practise to relieve the neck portion before the load becomes critical. For this purpose, the neck portion is widened and tapered again so as to produce a widened portion between an upper and a lower neck portion. The lower neck portion is designed to be thicker than the upper neck portion and correspondingly has a greater tensile strength. For relieving the upper neck portion, use is made of a supporting device which engages below the widened portion and at least partially bears the weight of the single crystal. By way of example, the widened portion can be shaped in the manner of a bicone or a sphere.

US 2008/0022922 A1 describes a supporting device which comprises a supporting ring having an opening and gripping catches which are arranged opposite one another on the supporting ring and can be tilted about an axis. The gripping catches can execute a tilting movement from a waiting position into a holding position, in which they extend into the opening and under the widened portion. The supporting device has the disadvantage that the gripping catches drop irreversibly into the holding position. The undamped dropping of the dropping catches promotes the production of particles which threaten the continued single-crystal growth of the crystal. In addition, the gripping catches can no longer be moved back into the waiting position in order to be able to back-melt the crystal following the occurrence of dislocations.

In accordance with U.S. Pat. No. 5,843,229, a supporting device can also be embodied in such a way that it is possible to engage under the widened portion reversibly. This is achieved by means of a gripping device having two arms which intersect at a rotation point and are moved toward one another and away from one another by means of hydraulically operating cylinders. A disadvantage with this embodiment is that the arms move past one another in shearing fashion, and therefore a high degree of particle formation in the vicinity of the growing single crystal must be expected. Furthermore, the cylinders likewise produce particles during operation. However, the use of a shield, which holds back particles, to protect the single crystal is insufficient because the shield needs to have leadthroughs for the arms. In addition, the leadthroughs need to have a sufficient width so as to avoid obstructing the sideways movement of the arms.

SUMMARY OF THE INVENTION

An aspect of the present invention is to provide a device for pulling a single crystal having a supporting device, by means of which it is possible to reversibly relieve the upper neck portion without therefore having to expect a high degree of particle formation in the vicinity of the growing single crystal.

An aspect of the present invention provides a device for pulling from a melt a single crystal having a widened portion between an upper and a lower neck portion, said device comprising a pulling device for pulling the single crystal and having a cable drum for winding a pulling cable; and a supporting device for relieving the upper neck portion of the weight of the single crystal, said supporting device comprising a supporting ring having an opening and having gripping catches which are fastened on the supporting ring such that they are opposite one another and can be pivoted about the axis of a bearing, wherein the gripping catches can execute a reversible pivoting movement from a waiting position into a holding position, in which they extend into the opening and under the widened portion; cable drums for winding bearing cables and auxiliary cables which are fastened on the gripping catches on both sides of the axis of the bearing of the gripping catches; and auxiliary rollers for changing the cable path of the auxiliary cables, as a result of which the pivoting movement of the gripping catches is brought about.

The device according to the invention makes it possible to reversibly relieve the upper neck portion of the single crystal. Although the gripping catches are also considered to be potential sources of particles in the vicinity of the single crystal, they can be adjusted in a controlled and careful manner such that they only rarely trigger dislocation events. In the holding position, the gripping catches are fixed in a mechanically stable manner such that secure load transfer is ensured.

According to the invention, a group of two or more gripping catches is pivotably mounted in a supporting ring and suspended on in each case two cables (a bearing cable and an auxiliary cable) on both sides of the axis for the pivoting movement in such a way that a controlled and reversible pivoting movement of the gripping catches takes place as a result of the respective auxiliary cable moving vertically in relation to the associated bearing cable. Furthermore, a synchronous vertical movement of the bearing and auxiliary cable relative to the seed holder with the gripping catches in the folded-in holding position permits a controlled load transfer. In a preferred embodiment of the invention, two gripping catches are moved by two bearing cables and two auxiliary cables which are wound onto a total of two cable drums which, for their part, run on a common drive shaft. As a result, only one drive motor is required to achieve the synchronous vertical movement of all the cables and therefore of the entire supporting device. In order to execute the vertical movement of the auxiliary cables in relation to the bearing cables, at least the auxiliary cables are guided via, in each case, one guide roller after running off the cable drums, and two auxiliary rollers are moved in controlled fashion into the cable path of the auxiliary cables by means of a drive, as a result of which the cable path of the auxiliary rollers is lengthened.

In a preferred embodiment of the invention, the cable drum for winding the pulling cable and its drive, the cable drums for winding the bearing cables and the auxiliary cables and their drive, and the auxiliary rollers and their drive are fastened on a common horizontal platform which can be set in a rotational movement about the axis of the pulling cable. This arrangement means that only one drive motor is required for the rotation of the seed holder and of the supporting device and the problem of synchronizing the rotational movements does not arise.

BRIEF DESCRIPTION OF THE DRAWINGS

The invention is explained in more detail below with reference to figures.

DETAILED DESCRIPTION

Figure 1:
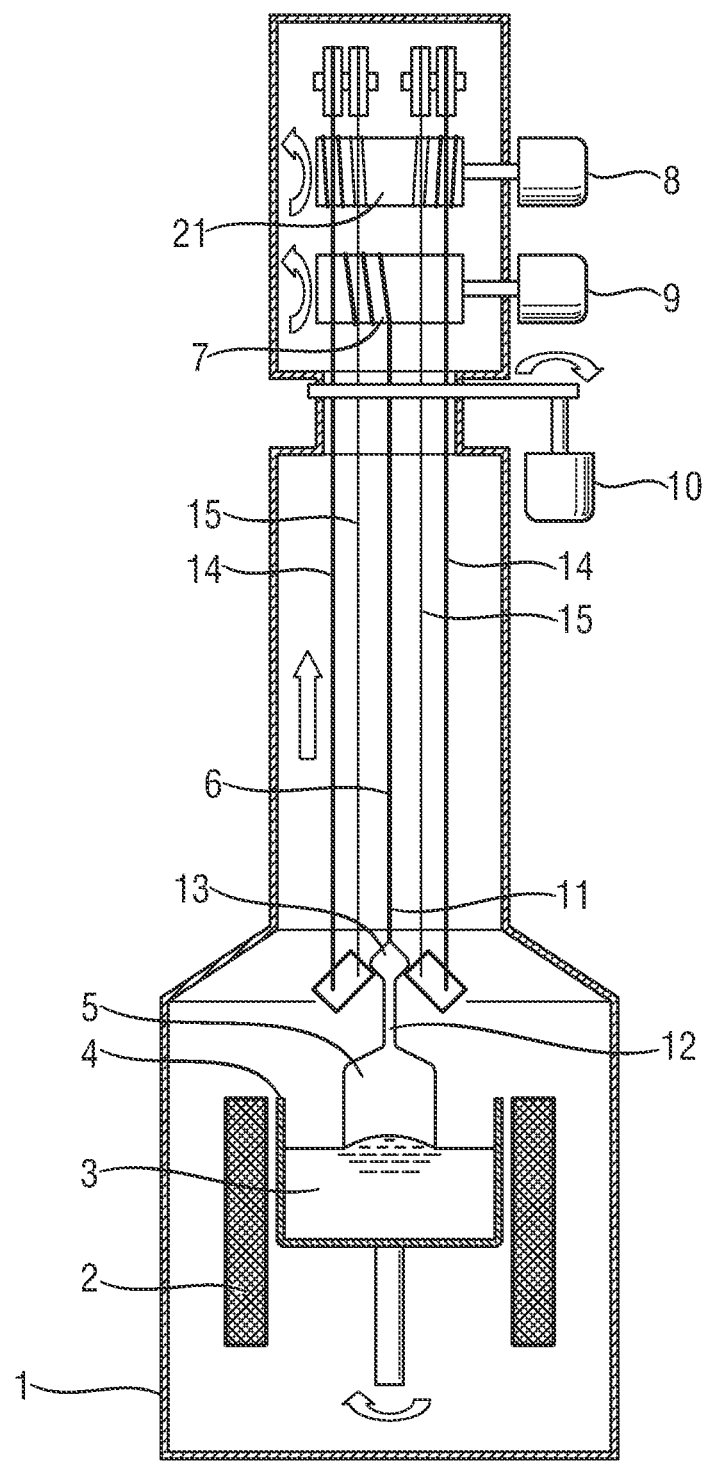
FIG. 1 shows a device according to the invention in a preferred configuration for producing silicon single crystals.
Figure 2:
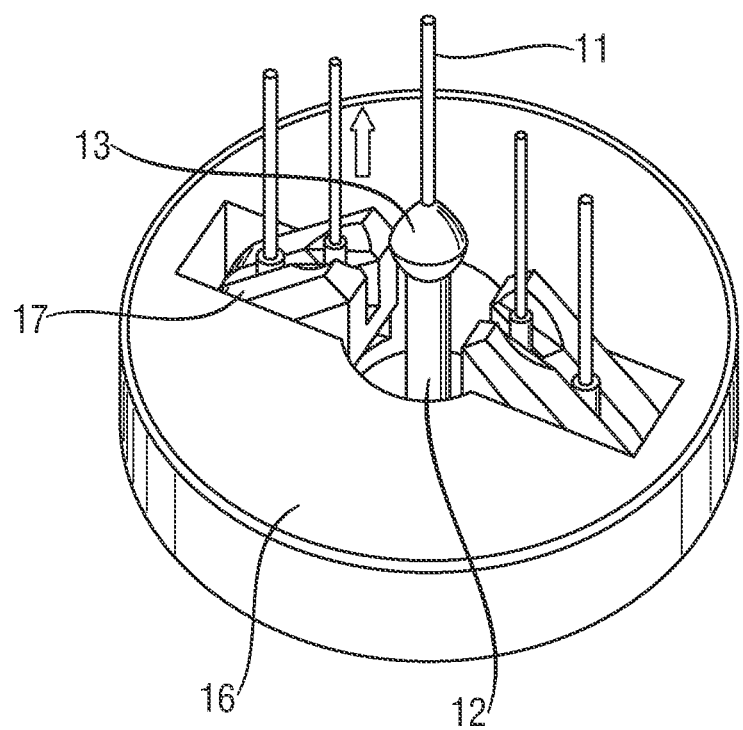
FIG. 2 shows the supporting ring with the gripping catches in the waiting position.
Figure 3:
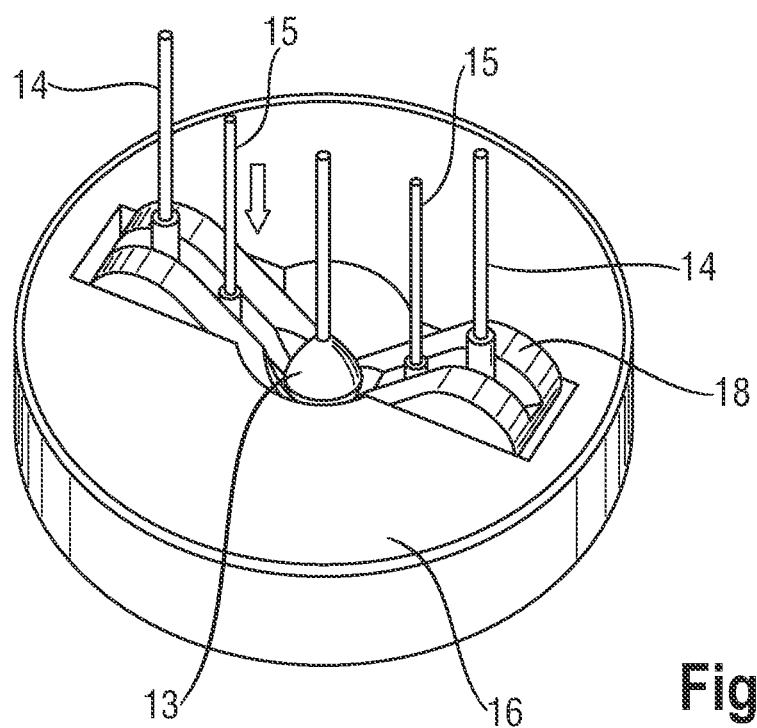
FIG. 3 shows the supporting ring with the gripping catches in the holding position.

The device according to FIG. 1 comprises a vacuum boiler 1 in the interior of which a graphite heating resistor 2 produces a silicon melt 3 in a quartz glass crucible 4. A silicon single crystal 5 is pulled from this silicon melt 3 using a pulling cable 6 which is wound onto a cable drum 7 when the latter is set in rotation by means of a lifting motor 9. The cable drum 7 and the lifting motor 9 are situated in a unit which is referred to as a cable rotary head and can be set in rotation by means of a rotation motor 10 such that the pulling cable 6 and the single crystal 5 also continuously rotate about their own axis. When heavy single crystals with a weight of approximately 300 kg and more are pulled, the bearing capacity of a thin silicon neck portion 11 which is required to eliminate shock dislocations after seeding no longer suffices so that a load support is required for the weight of the crystal. For this reason, pulling of the thin neck portion 11 is followed by pulling of a bicone 13 followed by a thick neck portion 12 which has a correspondingly higher bearing capacity and then the single crystal in a more specific sense, subdivided into an initial cone, a portion with a constant diameter and an end cone. In order to support the single crystal during the pulling process and to mechanically relieve the thin neck portion 11, use is made of a supporting device in which two gripping catches are pivotably mounted in an annular body, hereinbelow referred to as a supporting ring. The supporting ring 16 and the gripping catches are illustrated in detail in FIGS. 2 and 3. The gripping catches are denoted by 17 in the waiting position and by 18 in the holding position. The inwardly directed end of the gripping catches is embodied in such a way that it can be brought into contact with the bicone 13 of the single crystal 5 when the gripping catches 18 are in the holding position. The pivoting movement of the gripping catches is executed in a controlled and reversible manner with each gripping catch being fastened to two cables (bearing cable 14, auxiliary cable 15) and with the cable application points being situated on the gripping catches on both sides of the axis of the bearing. The pivoting movement of the gripping catches is triggered by a relative vertical movement of the cables 14, 15. When the supporting device is in the unloaded state, the auxiliary cables 15 can be used to pivot the gripping catches outward or inward by means of a movement relative to the bearing cables 14.

The supporting ring 16 is provided with stops for the gripping catches, said stops preventing a continued pivoting movement of the gripping catches 18 when the holding position has been reached. Once the gripping catches 18 have taken up the holding position, a synchronous upward movement of the cables 14, 15 is initiated until the inwardly directed end of the gripping catches comes into contact with the bicone 13 of the single crystal 5. A further slight upward movement of the cables 14, 15 leads to a supporting force being exerted on the bicone 13 on account of the elasticity of said cables, and said force relieves the thin neck portion 11. In this situation, the bearing cables 14 substantially serve as the bearing cables to which the weight of the single crystal is partially transferred by means of the stops in the supporting ring 16 and the bearings of the gripping catches.

Figure 4:
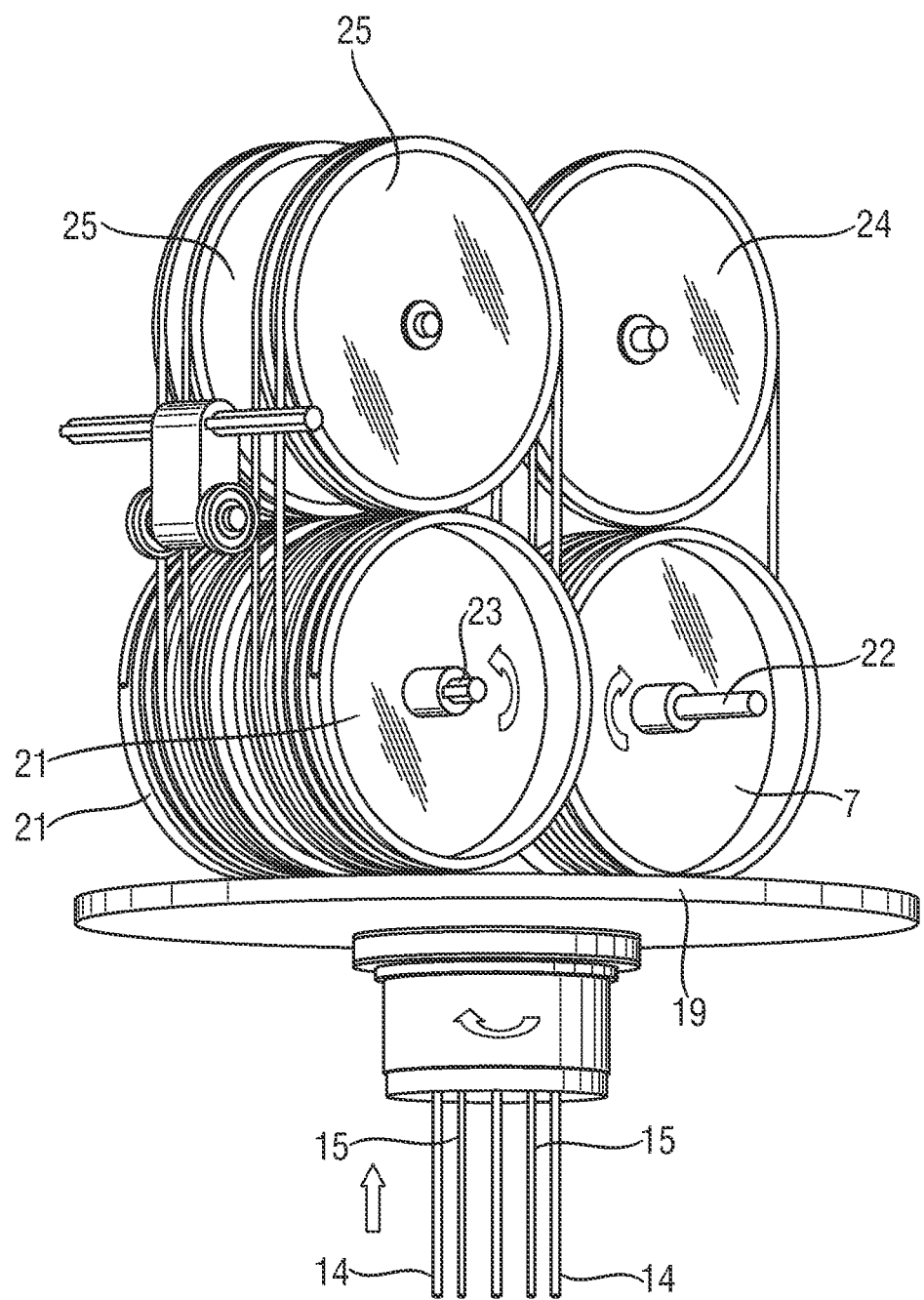
FIG. 4 shows elements of the pulling device and of the supporting device in a state in which the gripping catches are in the holding position.

The cable drum 7 for winding the pulling cable 6 and its stroke drive 9 as well as the cable drums 21 for winding the bearing cables 14 and the auxiliary cables 15 and their stroke drive 8 are mounted on a common horizontal platform 19 (FIG. 4). The platform 19 is set in rotation about the axis of the pulling cable 6 by the rotation drive 10. The drives 8 and 9 are therefore capable of driving the vertical movement of the pulling cable 6 and the synchronous vertical movement of the cables 14, 15 of the supporting device independently of one another. Since the relief of the thin neck portion 11 is intended to be initiated in a controlled manner after the gripping catches 18 have made contact with the bicone 13 of the single crystal 5, it is possible to insert above the cable drums 7, 21 guide rollers 24, 25 over which the cables 6, 14, 15 run and the bearings of which are each connected to load cells so that electronic signals relating to the loading due to the weight of the individual cables are available at any time. In order to ensure that all the cables 6, 14, 15 each run perpendicular to the guide rollers 24, 25, it is advantageous for the cable drums to be mounted on their drive shafts 22, 23 such that they can be displaced laterally and, if appropriate, adjusted when the cables are wound on and unwound.

Figure 5:
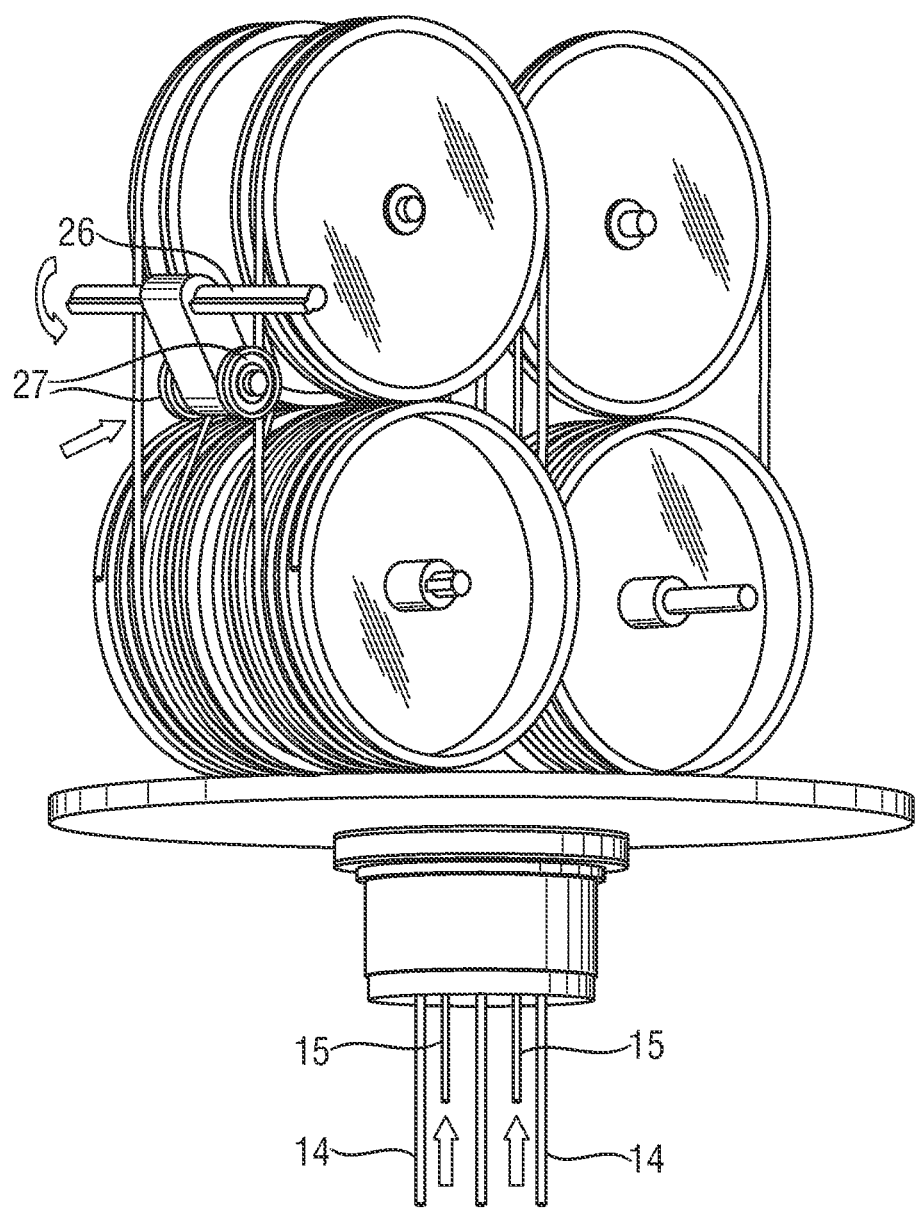
FIG. 5 shows elements of the pulling device and of the supporting device in a state in which the gripping catches are in the waiting position.

The movement of the cables 14, 15 in relation to one another in order to pivot the gripping catches could be achieved by using in each case one separate drive and one separate cable drum and also a guide roller for each bearing cable 14 and each auxiliary cable 15. However, it is particularly advantageous to use in each case one common cable drum 21 for a pair of cables 14, 15 which are fastened to the same gripping catch. This ensures a completely synchronous vertical movement of the two cables 14, 15 as the associated cable drum 21 rotates. The relative movement for pivoting the gripping catch is triggered by a small auxiliary roller 27 being introduced into the cable path of the auxiliary cable 15 and thereby lengthening said cable path (FIG. 5). In the case of a loaded supporting system with completely inwardly pivoted gripping catches 18 in contact with the bicone 13, the small auxiliary rollers 27 are removed from the cable path of the auxiliary cables 15 completely and therefore also do not disrupt the weight measurement for determining the supporting force of the supporting device (FIG. 4).

It is also particularly advantageous to use a common drive shaft 23 for all the cable drums 21, which means that the completely synchronous vertical run of all the cables 14, 15 and gripping catches can be effected using a single drive 8. A second drive shaft 22 serves, together with the independent drive 9 of the cable drum 7, to wind up the pulling cable 6. The entire process of transferring the load from the pulling cable 6 to the bearing cables 14 of the supporting device can therefore be controlled by controlling the drives 8 and 9 for the drive shafts 22, 23 taking into account the weight signals from the weighing of the guide rollers 24, 25. A third drive shaft 26 may use a relatively weak and simple drive to trigger the movement of the small auxiliary rollers 27 into the cable path of the auxiliary cables 15 if the supporting device is in the unloaded state (FIG. 5). The auxiliary cables 15 are thereby moved upward by a defined distance relative to the bearing cables 14 and this leads to the gripping catches pivoting outward. In this waiting position of the gripping catches 17, it is possible for the supporting device to be moved into a position of rest by means of a synchronous upward movement of all the cables 14, 15.

What is claimed is:

1. A device for pulling a single crystal from a melt having a widened portion between an upper and a lower neck portion, the device comprising:
   a pulling device having a pulling device cable drum configured to wind a pulling cable, the pulling cable configured to pull the single crystal; and
   a supporting device configured to relieve the upper neck portion of a weight of the single crystal, the supporting device including
      a supporting ring having an opening and a plurality of gripping catches disposed opposite one another on the supporting ring and configured to pivot reversibly about a bearing axis from a waiting position to a holding position, wherein in the holding position, the plurality of gripping catches extend into the opening under the widened portion of the single crystal, and wherein each gripping catch is associated with a bearing cable and an auxiliary cable;
      a plurality of gripping catch cable drums, wherein each gripping catch cable drum is configured as a common cable drum to wind the bearing cable and the auxiliary cable associated with the same gripping catch;
      a common drive configured to drive the plurality of gripping catch cable drums; and
      auxiliary rollers configured to change a path of a respective auxiliary cable so as to cause a respective gripping catch to pivot.

2. The device as recited in claim 1, further comprising a platform configured to rotate about an axis defined by the pulling cable, wherein the pulling device cable drum, the gripping catch cable drums and the auxiliary rollers are disposed on the platform.

3. A method for pulling a single crystal from a melt having a widened portion between an upper and a lower neck portion, the process comprising:
   winding a pulling cable using a pulling device cable drum;
   pulling the single crystal using the pulling cable; and
   relieving the upper neck portion of a weight of the single crystal, wherein the relieving includes
      providing a supporting ring having an opening and a plurality of gripping catches disposed opposite one another on the supporting ring;
      pivoting the plurality of gripping catches reversibly about a bearing axis between a waiting position and a holding position, wherein each gripping catch is associated with a bearing cable and an auxiliary cable;
      extending the plurality of gripping catches into the opening under the widened portion of the single crystal;
      providing a plurality of gripping catch cable drums, each gripping catch cable drum being configured as a common cable drum of the bearing cable and the auxiliary cable associated with the same gripping catch;
      winding the bearing cables and the auxiliary cables using the gripping catch cable drums;
      driving the gripping catch cable drums with a common drive;
      providing auxiliary rollers; and
      changing a path of a respective auxiliary cable using a respective auxiliary roller so as to cause a respective gripping catch to pivot.

4. The method as recited in claim 3, further comprising rotating a platform about an axis defined by the pulling cable, wherein the pulling device cable drum, the gripping catch cable drums and the auxiliary rollers are disposed on the platform.

\* \* \* \* \*